(12) United States Patent
Kil et al.

(10) Patent No.: US 7,772,132 B2
(45) Date of Patent: Aug. 10, 2010

(54) METHOD FOR FORMING TETRAGONAL ZIRCONIUM OXIDE LAYER AND METHOD FOR FABRICATING CAPACITOR HAVING THE SAME

(75) Inventors: Deok-Sin Kil, Ichon-shi (KR); Han-Sang Song, Ichon-shi (KR); Seung-Jin Yeom, Ichon-shi (KR); Ki-Seon Park, Ichon-shi (KR); Jae-Sung Roh, Ichon-shi (KR); Jin-Hyock Kim, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 656 days.

(21) Appl. No.: 11/476,789

(22) Filed: Jun. 29, 2006

(65) Prior Publication Data
US 2007/0232081 A1    Oct. 4, 2007

(30) Foreign Application Priority Data
Apr. 4, 2006  (KR)  ............... 10-2006-0030665

(51) Int. Cl.
*H01L 21/469* (2006.01)
*H01L 21/31* (2006.01)
(52) U.S. Cl. ............... 438/785; 257/E21.489; 438/778
(58) Field of Classification Search ......... 257/E21.489; 438/778, 785
See application file for complete search history.

(56) References Cited

U.S. PATENT DOCUMENTS

| 6,297,539 | B1 * | 10/2001 | Ma et al. .............. 257/410 |
| 6,753,224 | B1 | 6/2004 | Lin et al. |
| 7,053,009 | B2 * | 5/2006 | Conley et al. .......... 438/785 |
| 7,087,482 | B2 * | 8/2006 | Yeo et al. .............. 438/240 |

(Continued)

FOREIGN PATENT DOCUMENTS

CN    1396638 A    2/2003

(Continued)

OTHER PUBLICATIONS

English translation of Notification for the Opnion of Examination issued from the Taiwanese Intellectual Property Office on May 6, 2009, in counterpart Taiwanese Patent Application No. 95123523.

(Continued)

*Primary Examiner*—Asok K Sarkar
(74) *Attorney, Agent, or Firm*—IP & T Law Firm PLC

(57) ABSTRACT

A method for forming a zirconium oxide ($ZrO_2$) layer on a substrate in a chamber includes controlling a temperature of the substrate; and repeating a unit cycle of an atomic layer deposition (ALD) method. The unit cycle includes supplying a zirconium (Zr) source into a chamber, parts of the Zr source being adsorbed into a surface of the substrate; purging non-adsorbed parts of the Zr source remaining inside the chamber; supplying a reaction gas for reacting with the adsorbed parts of the Zr source; and purging non-reacted parts of the reaction gas remaining inside the chamber and reaction byproducts, wherein the temperature of the substrate and a concentration of the reaction gas are controlled such that the $ZrO_2$ layer is formed with a tetragonal structure.

28 Claims, 7 Drawing Sheets

U.S. PATENT DOCUMENTS

| | | |
|---|---|---|
| 2002/0001974 A1 | 1/2002 | Chan |
| 2004/0009679 A1 | 1/2004 | Yeo et al. |
| 2005/0124175 A1* | 6/2005 | Ahn et al. .................. 438/785 |
| 2005/0170667 A1 | 8/2005 | Conley, Jr. et al. |

FOREIGN PATENT DOCUMENTS

| | | |
|---|---|---|
| JP | 2004-288923 | 10/2004 |
| KR | 10-20050029339 | 3/2005 |
| KR | 10-20050050003 | 5/2005 |
| WO | WO 2004/017377 A2 | 2/2004 |

OTHER PUBLICATIONS

First Office Action issued on Jun. 5, 2009, from the State Intellectual Property Office of the People's Republic of China in counterpart Chinese Patent Application No. 200610161039.7.

* cited by examiner

METHOD FOR FORMING TETRAGONAL ZIRCONIUM OXIDE LAYER AND METHOD FOR FABRICATING CAPACITOR HAVING THE SAME

RELATED APPLICATION

The present application is based upon and claims the benefit of priority from Korean patent application No. KR 2006-0030665, filed in the Korean Patent Office on Apr. 4, 2006, the entire contents of which are incorporated herein by reference.

TECHNICAL FIELD

The present invention relates to a method for fabricating a semiconductor device; and more particularly, to a method for forming a zirconium oxide ($ZrO_2$) layer and a method for fabricating a capacitor having the same.

DESCRIPTION OF RELATED ARTS

Recently, there has been an effort to apply a zirconium oxide ($ZrO_2$) layer as a dielectric layer of a capacitor for a dynamic random access memory (DRAM) device with a size less than approximately 60 nm. However, if the $ZrO_2$ layer is formed at a temperature less than approximately 250° C. through an atomic layer deposition (ALD) method and then, subjected to a thermal treatment, the $ZrO_2$ layer with a monoclinic structure or a cubic structure having a low dielectric constant is generally obtained.

The $ZrO_2$ layer needs to be formed with a tetragonal structure instead of the monoclinic structure or the cubic structure to secure a high dielectric constant. However, it is very difficult to obtain the $ZrO_2$ layer with tetragonal structure because the tetragonal structure is a structure more stable at a high temperature than the monoclinic structure or the cubic structure.

SUMMARY

Methods consistent with the present invention provide for forming a zirconium oxide ($ZrO_2$) layer with a tetragonal structure, which has a high dielectric constant and is stable at a high temperature. Methods consistent with the present invention also provide for fabricating a capacitor having such a $ZrO_2$ layer.

Consistent with the present invention, there is provided a method for forming a zirconium oxide ($ZrO_2$) layer on a substrate in a chamber. The method includes controlling a temperature of the substrate; and repeating a unit cycle of an atomic layer deposition (ALD) method. The unit cycle includes supplying a zirconium (Zr) source into a chamber, parts of the Zr source being adsorbed into a surface of the substrate; purging non-adsorbed parts of the Zr source remaining inside the chamber; supplying a reaction gas for reacting with the adsorbed parts of the Zr source; and purging non-reacted parts of the reaction gas remaining inside the chamber and reaction byproducts, wherein the temperature of the substrate and a concentration of the reaction gas are controlled such that the $ZrO_2$ layer is formed with a tetragonal structure.

Consistent with the present invention, there is provided a method for forming a $ZrO_2$ layer on a substrate in a chamber. The method includes repeating a unit cycle of an atomic layer deposition (ALD) method. The unit cycle includes a first part and a second part. The first part includes supplying a zirconium (Zr) source into the chamber, parts of the Zr source being adsorbed into a surface of the substrate, purging non-adsorbed parts of the Zr source remaining inside the chamber, supplying a first reaction gas for reacting with the adsorbed parts of the Zr source, and purging non-reacted parts of the first reaction gas remaining inside the chamber and reaction byproducts. The second part includes supplying a second reaction gas for reacting with the adsorbed parts of the Zr source, and purging non-reacted parts of the second reaction gas remaining inside the chamber and reaction byproducts.

Consistent with the present invention, there is provided a method for fabricating a capacitor. The method includes forming a bottom electrode on a substrate; forming a zirconium oxide ($ZrO_2$) layer having a tetragonal structure over the bottom electrode through an atomic layer deposition (ALD) method; performing a first annealing process to improve a tetragonality of the $ZrO_2$ layer; forming a top electrode over the $ZrO_2$ layer; and performing a second annealing process to improve a dielectric property of the $ZrO_2$ layer.

It is to be understood that both the foregoing general description and the following detailed description are exemplary and explanatory and are intended to provide further explanation of the invention as claimed.

BRIEF DESCRIPTION OF THE DRAWINGS

The above and other features will become better understood with respect to the following description of the preferred embodiments given in conjunction with the accompanying drawings, in which.

DETAILED DESCRIPTION

Hereinafter, detailed descriptions of embodiments of the present invention will be provided with reference to the accompanying drawings.

Figure 1:
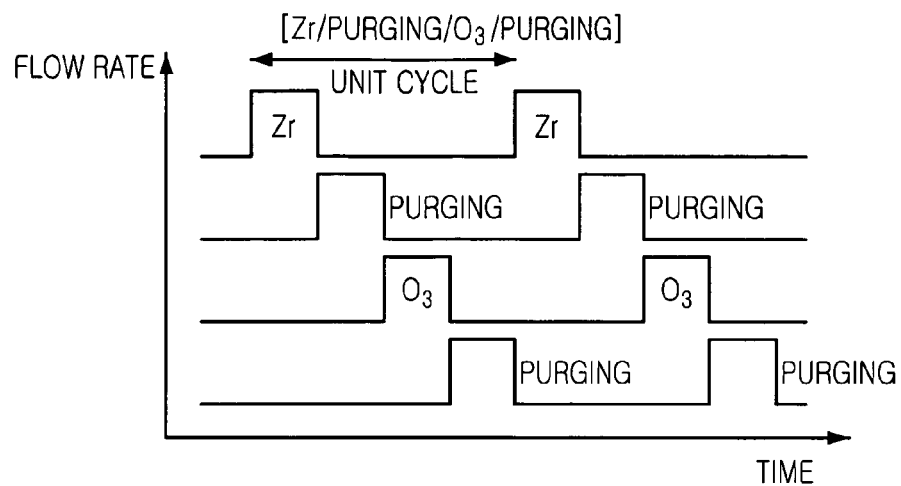
FIG. 1 is a graph illustrating a sequence of gas supply for forming a zirconium oxide ($ZrO_2$) layer using an atomic layer deposition (ALD) method consistent with a first embodiment of the present invention.

FIG. 1 is a graph illustrating a sequence of gas supply for forming a zirconium oxide ($ZrO_2$) layer using an atomic layer deposition (ALD) method consistent with a first embodiment of the present invention.

Consistent with the first embodiment of the present invention, a $ZrO_2$ layer is deposited through an atomic layer deposition (ALD) method by repeating a unit cycle for forming an atomic layer of $ZrO_2$, the unit cycle including supplying a zirconium (Zr) source, purging, supplying a reaction gas, and purging. The unit cycle is repeated until a thin film with a desirable thickness is obtained. That is, as for the unit cycle to deposit the $ZrO_2$ layer, the Zr source is supplied and then, adsorbed into the surface of a substrate. Non-adsorbed parts of the Zr source remaining inside the chamber are purged out of the chamber. The reaction gas is supplied into the chamber and reacts with adsorbed parts of the Zr source. Through the above reaction of the reaction gas and the adsorbed parts of the Zr source, a desirable $ZrO_2$ layer is deposited. Afterwards, a purge gas is flowed again and thus, non-reacted parts of the reaction gas remaining inside the chamber are purged out.

For instance, the unit cycle denoted with [Zr/purging/$O_3$/purging] to deposit the $ZrO_2$ layer, i.e., the unit cycle including supplying the Zr source (denoted with 'Zr'), purging, supplying $O_3$ gas (denoted with '$O_3$') and purging, is performed through the ALD method and is repeated until a desirable thickness, e.g., a thickness ranging from approximately 30 Å to approximately 300 Å, of the $ZrO_2$ layer is obtained. During depositing the $ZrO_2$ layer, a substrate temperature ranges from approximately 250° C. to approximately 350° C., and a pressure of the chamber ranges from approximately 0.1 torr to approximately 1 torr.

In more details of FIG. 1, a Zr source may be selected from a group consisting of $Zr(O-tBu)_4$, $Zr[N(CH_3)_2]_4$, $Zr[N(C_2H_5)(CH_3)]_4$, $Zr[N(C_2H_5)_2]_4$, $Zr(TMHD)_4$, $Zr(OiC_3H_7)_3(TMHD)$, and $Zr(OtBu)_4$. The Zr source is supplied and adsorbed into the surface of a substrate. The Zr source may be supplied using a carrier gas such as argon (Ar) gas. The Ar gas may be supplied with a flow rate ranging from approximately 150 sccm (standard cubic centimeter per minute) to approximately 250 sccm for a period ranging from approximately 0.1 seconds to approximately 10 seconds.

A purge gas such as nitrogen ($N_2$) or Ar is then supplied into the chamber. The purge gas purges out the non-adsorbed parts of the Zr source remaining inside the chamber. The purge gas may be supplied with a flow rate ranging from approximately 200 sccm to approximately 400 sccm for a period ranging from approximately 3 seconds to approximately 10 seconds.

A reaction gas, such as $O_3$ gas serving as an oxidant, is then supplied into the chamber. The supplying of the reaction gas induces a reaction of the adsorbed parts of the Zr source with the $O_3$ gas. The $O_3$ gas may be supplied with a flow rate ranging from approximately 0.1 slm (standard liter per minute) to approximately 1 slm for a period ranging form approximately 1 second to approximately 10 seconds.

A purge gas such as $N_2$ or Ar is then supplied into the chamber again. The purge gas purges out the non-reacted parts of the $O_3$ gas remaining inside the chamber and reaction byproducts. The purge gas may be supplied with a flow rate ranging from approximately 50 sccm to approximately 200 sccm for a period ranging from approximately 3 seconds to approximately 10 seconds.

The above described unit cycle including supplying the Zr source, purging, supplying the $O_3$ gas, and purging, is repeatedly performed to deposit a $ZrO_3$ layer with a thickness ranging from approximately 30 Å to approximately 300 Å.

During depositing the $ZrO_2$ layer through the ALD method, the substrate temperature (or a process temperature) ranges from approximately 250° C. to approximately 350° C. particularly in case of using a single wafer type apparatus to obtain a tetragonal structure. Herein, a crystallization of the $ZrO_2$ layer can be changed according to the range of the substrate temperature. The different kinds of the crystallization of the $ZrO_2$ layer according to the range of the substrate temperature will be explained later.

For the reaction gas (or the oxidant), $O_3$ plasma or oxygen ($O_2$) plasma can be used in addition to the $O_3$ gas.

The non-reacted parts of the reaction gas or the reaction byproducts can be purged out using a vacuum pump or supplying $N_2$ or an inert gas such as Ar into the chamber.

The ALD method of the $ZrO_2$ layer is performed at the single wafer type apparatus or a batch type furnace to obtain the $ZrO_2$ layer with the tetragonal structure.

Consistent with the first embodiment of the present invention as described in FIG. 1, the substrate temperature (or the process temperature), a concentration of the $O_3$ gas, and the period of supplying the $O_3$ gas are controlled to improve tetragonality of the $ZrO_2$ layer. For example, the substrate temperature may range from approximately 250° C. to approximately 350° C.; the concentration of the $O_3$ gas may be approximately 150 g/m$^3$ or more, and particularly may be from approximately 150 g/m$^3$ to approximately 500 g/m$^3$; and the period of supplying the $O_3$ gas may be at least approximately 1 second, and particularly may be from approximately 1 second to approximately 10 seconds).

Figure 2:
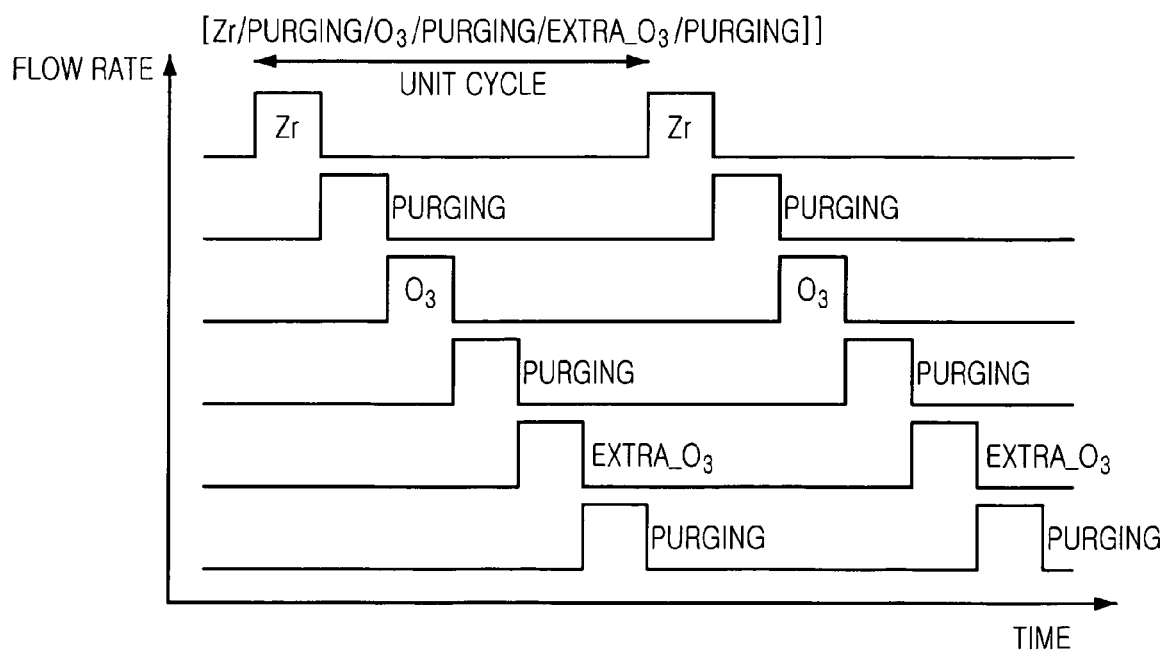
FIG. 2 is a graph illustrating a sequence of gas supply for forming a $ZrO_2$ layer using an atomic layer deposition (ALD) method consistent with a second embodiment of the present invention.

FIG. 2 is a graph illustrating a sequence of gas supply for forming a $ZrO_2$ layer using an ALD method consistent with a second embodiment of the present invention.

Compared to the unit cycle of the first embodiment of the present invention, a unit cycle consistent with the second embodiment of the present invention includes an additional step of supplying extra $O_3$ gas denoted with 'Extra_$O_3$' in FIG. 2 and an additional step of purging to improve tetragonality of a $ZrO_2$ layer.

Accordingly, a unit cycle consistent with the second embodiment of the present invention includes supplying a Zr source, purging, supplying $O_3$ gas, purging, supplying extra $O_3$ gas, and purging, and may be denoted as [Zr/purging/$O_3$/purging/Extra_$O_3$/purging]. The extra $O_3$ gas improves tetragonality of the $ZrO_2$ layer.

During supplying the extra $O_3$ gas, the $O_3$ gas serves as a reaction gas and may be supplied with a flow rate ranging from approximately 0.1 slm to approximately 1 slm for a period ranging from approximately 1 second to approximately 10 seconds. To improve the tetragonality of the $ZrO_2$ layer, the $O_3$ gas may have a concentration of at least approximately 150 g/m$^3$, more particularly from approximately 150 g/m$^3$ to approximately 500 g/m$^3$, and a period of supplying the extra $O_3$ gas may be at least approximately 1 second, more particularly from approximately 1 second to approximately 10 seconds.

After depositing the $ZrO_2$ layer by the sequences of gas supply shown in FIGS. 1 and 2, a post-annealing process may be performed at approximately 400° C. to improve the tetragonality of the $ZrO_2$ layer. Accordingly, crystallization can be formed due to the post-annealing process. The post-annealing process may be a rapid thermal annealing process or a furnace annealing process. The post-annealing process may be performed in an atmosphere selected from a group consisting of $O_2$, $O_3$, and $O_2$ plasma. In case of using the furnace annealing process, a gas may be supplied at a flow rate ranging from approximately 5 sccm to approximately 5 slm and at a temperature ranging from approximately 600° C. to approximately 800° C. In case of using the rapid thermal annealing process, a gas may be supplied with a flow rate ranging from approximately 5 sccm to approximately 5 slm in a chamber, where the chamber has a temperature ranging from approximately 400° C. to approximately 800° C. and one of an increasing pressure ranging from approximately 700 torr to approximately 760 torr and a decreasing pressure ranging from approximately 1 torr to approximately 100 torr.

Consistent with the above-described embodiments of the present invention, a $ZrO_2$ layer is deposited using the ALD method capable of controlling a slow deposition rate to form a tetragonal structure of the $ZrO_2$ layer so that the $ZrO_2$ layer has a high dielectric constant at a low temperature. Since the ALD method is used, the deposition rate is very slow. Accordingly, a similar effect obtained through a typical high temperature chemical vapor deposition (CVD) method can be obtained and thus, the $ZrO_2$ layer can be formed in a stable structure. Furthermore, to improve a moving path on a reaction surface of atoms and molecules, the $O_3$ gas is used as the reaction gas during depositing the $ZrO_2$ layer. At this time, the concentration of the $O_3$ gas and an exposed time are controlled to improve the tetragonality of the $ZrO_2$ layer.

Thus, consistent with the second embodiment of the present invention, the substrate temperature, the supplying time of the $O_3$ gas and the concentration of the $O_3$ gas are controlled to obtain the $ZrO_2$ layer with the tetragonal structure. Furthermore, the unit cycle includes supplying extra $O_3$ gas.

Figure 3:
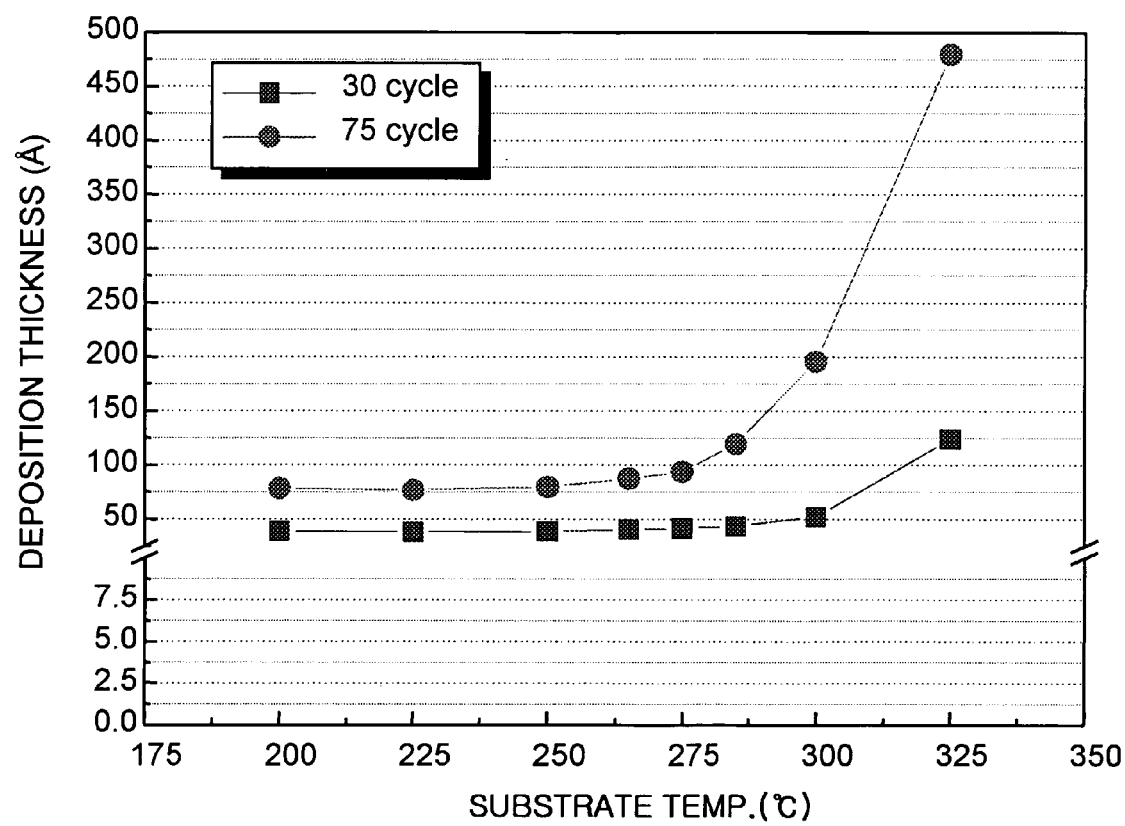
FIG. 3 is a graph illustrating a thickness of a $ZrO_2$ layer changing with a substrate temperature.

FIG. 3 is a graph illustrating a relationship between a thickness of a $ZrO_2$ layer deposited with a method consistent with embodiments of the present invention with a substrate temperature during the deposition of the $ZrO_2$ layer. In FIG. 3, the horizontal axis indicates a substrate temperature (° C.) and the vertical axis indicates a deposition thickness (Å).

A deposition rate is almost constant when the substrate temperature is between approximately 200° C. and approximately 300° C. During that temperature range, a thickness of the $ZrO_2$ layer stays at approximately 50 Å and slowly increases with the substrate temperature. However, if the unit cycle described in FIG. 1 or FIG. 2 is repeated for a great number of times, e.g., 70 times, the deposition rate can be increased at approximately 275° C. and above.

When the $ZrO_2$ layer is deposited through an ALD method, and the substrate temperature is approximately 300° C. or lower, the deposition rate is very slow. Accordingly, the tetragonal structure of the $ZrO_2$ layer can be formed at a low temperature.

Figure 4:
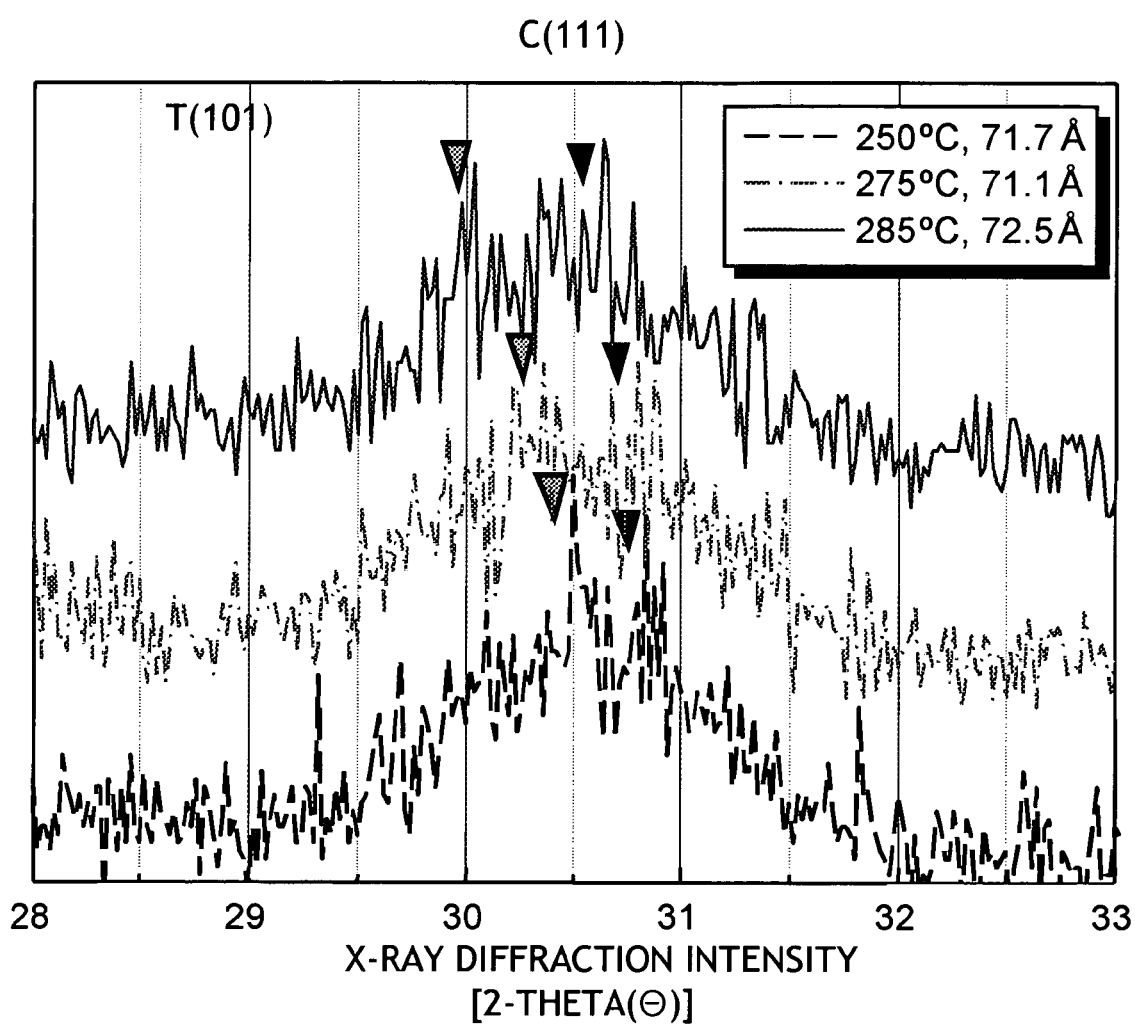
FIG. 4 is a graph illustrating crystallization of a $ZrO_2$ layer changing with a substrate temperature.

FIG. 4 is a graph illustrating crystallization of a $ZrO_2$ layer changing with a substrate temperature. This graph shows results analyzed by an X-ray diffraction. In FIG. 4, a bottom line, a middle line and a top line show the crystallization of the $ZrO_2$ layer changing at a substrate temperature of approximately 250° C., approximately 275° C. and approximately 285° C., respectively.

A cubic structure [C(111)] is mainly illustrated at the substrate temperature of approximately 250° C. However, as the substrate temperature increases to approximately 275° C. and to approximately 285° C., a fraction of a tetragonal structure [T(101)] is increased. Accordingly, it is shown that the crystallization of the $ZrO_2$ layer can be controlled by changing the substrate temperature during performing the ALD method.

According to the results shown in FIGS. 3 and 4, the $ZrO_2$ layer can be formed with a tetragonal structure by controlling the substrate temperature to be low during performing the ALD method. Particularly, the substrate temperature during performing the ALD method to obtain the $ZrO_2$ layer with the tetragonal structure may range from approximately 250° C. to approximately 350° C. If the substrate temperature is higher than approximately 350° C., the deposition rate becomes fast and thus, the $ZrO_2$ layer with a stable structure cannot be obtained. If the substrate temperature is lower than approximately 250° C., the $ZrO_2$ layer with the tetragonal structure cannot be obtained and thus, it is difficult to secure a high dielectric constant.

Figure 5:
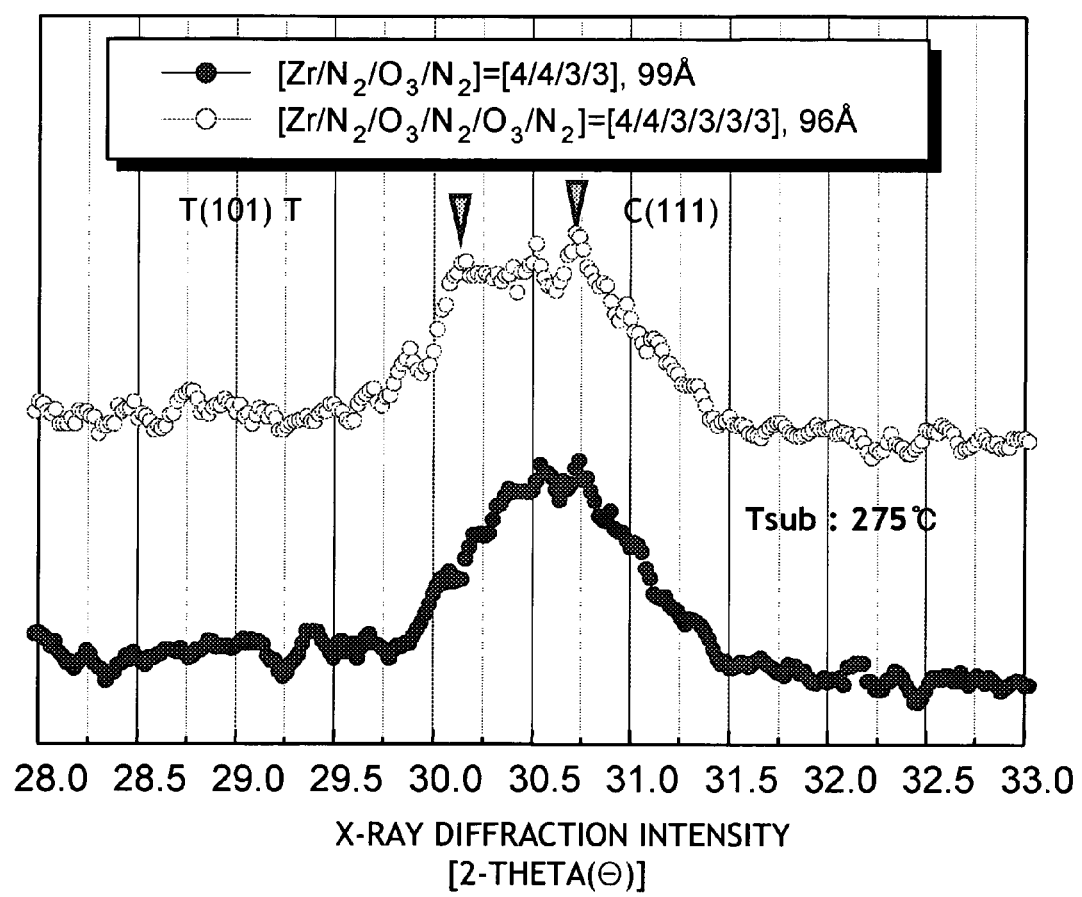
FIG. 5 is a graph comparing crystallization of a $ZrO_2$ layer deposited by a method consistent with the second embodiment of the present invention with that of a $ZrO_2$ layer deposited by a method consistent with the first embodiment of the present invention.

FIG. 5 is a graph comparing crystallization of a $ZrO_2$ layer deposited by a method consistent with the second embodiment of the present invention with that of the $ZrO_2$ layer deposited by a method consistent with the first embodiment of the present invention. As FIG. 5 shows, a $ZrO_2$ layer deposited by a method consistent with the second embodiment of the present invention exhibits a tetragonal structure in addition to a cubic structure.

According to the results shown in FIGS. 4 and 5, when the $ZrO_2$ layer is formed through the ALD method, by controlling the substrate temperature and the exposed time of the $O_3$ gas which is the reaction gas, it is possible to form the $ZrO_2$ layer with the tetragonal structure having a higher dielectric constant, which is difficult to obtain at a room temperature.

In the above, $O_3$ gas was assumed to be the reaction gas. However, other reaction gases, such as $O_3$ plasma or oxygen ($O_2$) plasma, may also be used for forming a $ZrO_2$ layer with a tetragonal structure. The tetragonal structure can be formed by controlling the concentration (or a flow rate) of the reaction gas and the exposed time of the reaction gas.

Figure 6A:
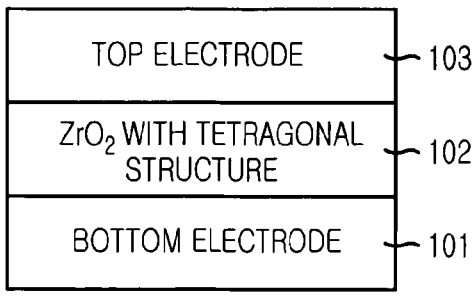
FIG. 6A is a diagram illustrating a capacitor with a metal-insulator-metal (MIM) structure using a $ZrO_2$ layer as a dielectric layer consistent with a third embodiment of the present invention.
Figure 6B:
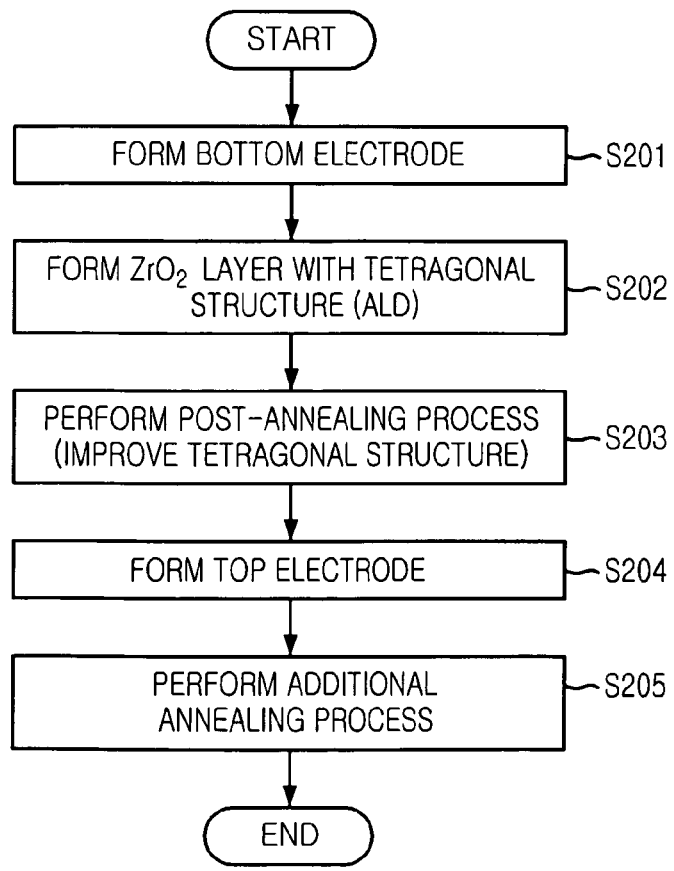
FIG. 6B is a flow chart illustrating a method for fabricating the capacitor shown in FIG. 6A.

FIG. 6A is a diagram illustrating a capacitor with a metal-insulator-metal (MIM) structure using a $ZrO_2$ layer as a dielectric layer consistent with a third embodiment of the present invention. FIG. 6B is a flow chart illustrating a method for forming the capacitor shown in FIG. 6A.

In FIG. 6B, the method for forming the capacitor is performed with the steps of forming a bottom electrode (S201), depositing a $ZrO_2$ layer through an ALD method (S202), performing a post-annealing process (S203), forming a top electrode (S204), and performing an additional annealing process (S205).

With reference to FIGS. 6A and 6B, the method for forming the capacitor will be explained in detail.

A bottom electrode 101 is formed. (S201) Bottom electrode 101 may be flat, concave, or cylindrical. The bottom electrode 101 can be formed using a material selected from a group consisting of polysilicon doped with impurities, titanium nitride (TiN), ruthenium (Ru), platinum (Pt), iridium (Ir), ruthenium oxide ($RuO_2$), zirconium nitride (ZrN), and hafnium nitride (HfN). The bottom electrode 101 may be deposited using one of a chemical vapor deposition (CVD) method, a sputtering method, an ALD method, and an electric plating method.

A $ZrO_2$ layer 102 is formed over the bottom electrode 101 using the ALD method consistent with the first or second embodiment of the present invention. (S202) The $ZrO_2$ layer 102 may be deposited with a thickness ranging from approximately 30 Å to approximately 300 Å through the ALD method as described above.

A post-annealing process is performed. (S203) The post-annealing process is performed to crystallize the $ZrO_2$ layer 102, i.e., to improve a tetragonal structure of the $ZrO_2$ layer. The post-annealing process may be performed using one of a rapid thermal annealing process and a furnace annealing process. In the performing the post-annealing process, $O_2$, $O_3$ or $O_2$ plasma can be used as an annealing gas. In case of using the furnace annealing process, an atmosphere gas may be selected from a group consisting of $O_2$, $O_3$, and $O_2$ plasma, and may be supplied with a flow rate ranging from approximately 5 sccm to approximately 5 slm and at a temperature ranging from approximately 600° C. to approximately 800° C. In case of using the rapid thermal process, an atmosphere gas may be selected from a group consisting of $O_2$, $O_3$ and $O_2$ plasma and may be supplied with a flow rate ranging from approximately 5 sccm to approximately 5 slm into a chamber, where the chamber has a temperature ranging from approximately 400° C. to approximately 800° C. and one of an increasing pressure ranging from approximately 700 torr to approximately 760 torr and a decreasing pressure ranging from approximately 1 torr to approximately 10 torr.

A top electrode 103 is over the $ZrO_2$ layer 102. (S204) The top electrode 103 may be formed using a material selected from a group consisting of polysilicon doped with impurities, TiN, Ru, Pt, Ir, $RuO_2$, ZrN, and HfN. The top electrode 103 is deposited through one selected from a group consisting of a CVD method, a sputtering method, an ALD method, and an electric plating method.

An additional annealing process is performed to improve a dielectric property of the $ZrO_2$ layer 102, i.e., to improve an electric property. (S205) The additional annealing process is performed in an atmosphere selected from a group consisting of $N_2$, Ar, and vacuum using one of a rapid thermal method and a furnace annealing method.

Although a single $ZrO_2$ layer is exemplified as a dielectric layer of the capacitor, the dielectric layer of the capacitor may have a stack structure including the $ZrO_2$ layer and one selected from a group consisting of aluminum oxide ($Al_2O_3$), titanium oxide ($TiO_2$), tantalum oxide ($Ta_2O_5$), hafnium oxide ($HfO_2$), and lanthanum oxide ($La_2O_3$).

Figure 7:
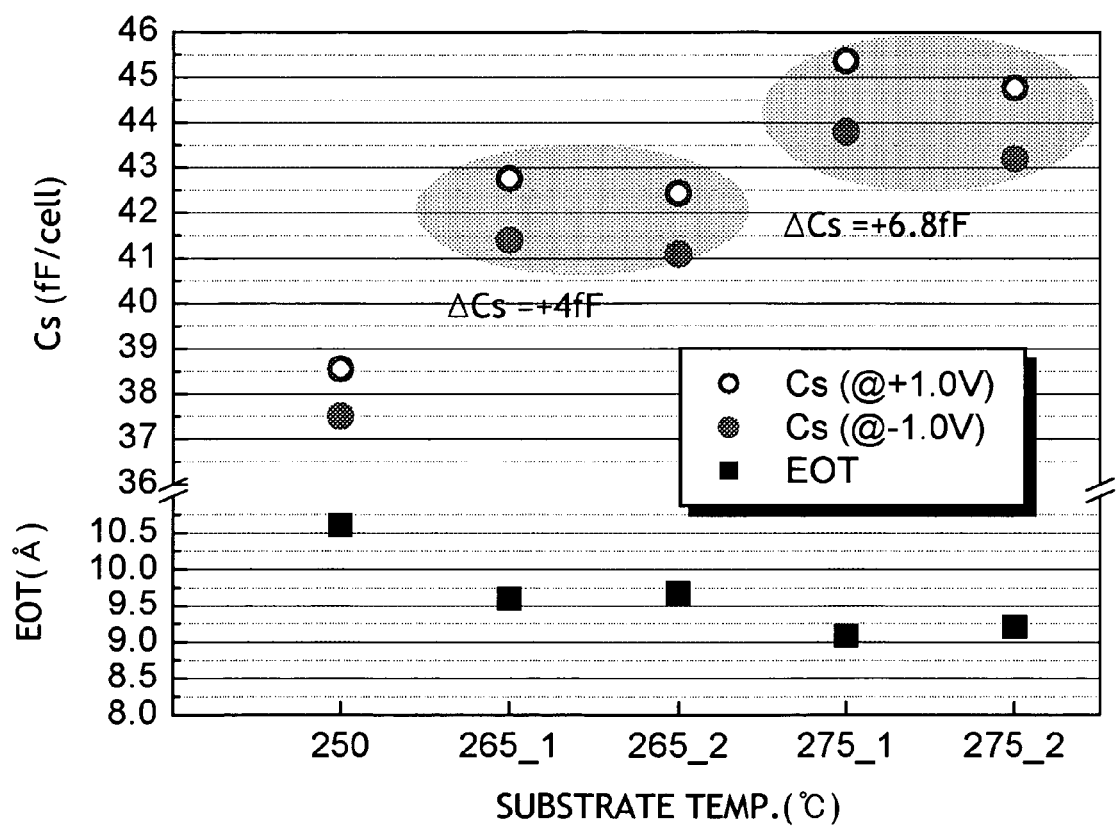
FIG. 7 is a graph illustrating a change in a dielectric property of a capacitor with a MIM structure using a $ZrO_2$ layer deposited by controlling a substrate temperature during an atomic layer deposition (ALD) process.

FIG. 7 is a graph illustrating a change, with a substrate temperature, in a dielectric property of a capacitor with a MIM structure using a $ZrO_2$ layer deposited through controlling a substrate temperature during performing an ALD method.

A dielectric capacitance increases with the substrate temperature, by forming the $ZrO_2$ layer with a tetragonal structure. If the substrate temperature is approximately 250° C., the dielectric capacitance ranges from approximately 37 fF/cell to approximately 39 fF/cell. However, if the substrate temperature is increased to approximately 265° C. (two samples shown in FIG. 7 as 265_1 and 265_2) and to approximately 275° C. (two samples shown in FIG. 7 as 275_1 and 275_2), the range dielectric capacitance increases to from approximately 41 fF/cell to approximately 43 fF/cell (at 265° C.) and from approximately 43 fF/cell to approximately 46 fF/cell (at 275° C.). Accordingly, in accordance with the described embodiment of the present invention, crystallization of the $ZrO_2$ layer is formed in a tetragonal structure by controlling the substrate temperature through the ALD method. The $ZrO_2$ layer with the tetragonal structure is used as the dielectric layer of the capacitor. Accordingly, the dielectric capacitance of the capacitor can be increased.

Also as FIG. 7 shows, the higher the substrate temperature is, the less an effective oxide thickness (EOT), which is defined as the thickness of an oxide layer for maintaining the same capacitance had the oxide layer replaced the dielectric layer in the capacitor. Highly integrated devices require the deceased effective oxide thickness (EOT). As the effective oxide thickness (EOT) gets decreases, a high dielectric capacitance can be obtained. Accordingly, the high dielectric capacitance can be applied to the highly integrated devices. As the substrate temperature is increased to approximately 275° C., the effective oxide thickness (EOT) decreases to approximately 9 Å. Accordingly, if the $ZrO_2$ layer with the tetragonal structure is applied as the dielectric layer of the capacitor, a very low effective oxide thickness (EOT) with approximately 9 Å can be obtained.

FIG. 7 also shows that a change in the dielectric capacitance with voltage, e.g., the change $\Delta Cs$ in the dielectric capacitance when the voltage across the capacitor changes from approximately +1.0V to approximately -1.0V, increases as the substrate temperature increases.

Figure 8:
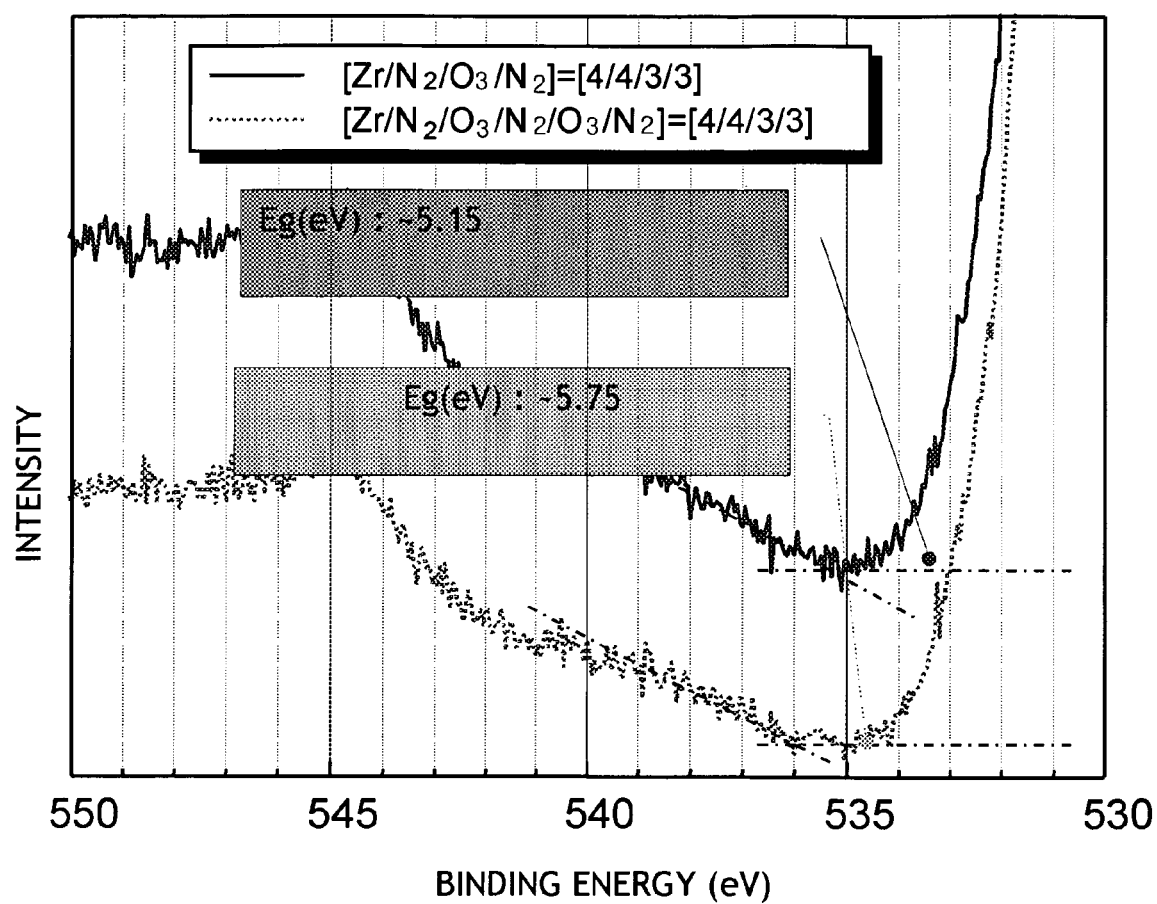
FIG. 8 is a graph comparing an energy band gap (Eg) of a $ZrO_2$ layer deposited by a method consistent with the second embodiment of the present invention with that of a $ZrO_2$ layer deposited by a method consistent with the first embodiment of the present invention.

FIG. 8 is a graph comparing an energy band gap (Eg) of a $ZrO_2$ layer deposited by a method consistent with the second embodiment of the present invention with that of the $ZrO_2$ layer deposited by a method consistent with the first embodiment of the present invention.

The energy band gap (Eg) of a $ZrO_2$ layer formed by a method consistent with the second embodiment of the present invention is wider in comparison with that of a $ZrO_2$ layer deposited by a method consistent with the first embodiment of the present invention. Particularly, a method consistent with the second embodiment of the present invention may deposit a $ZrO_2$ layer with an energy band gap of approximately 5.75 eV. A method consistent with the first embodiment of the present invention may deposit a $ZrO_2$ layer with an energy band gap of approximately 5.15 eV.

According to the results shown in FIGS. 7 and 8, the $ZrO_2$ layer with the tetragonal structure having a high dielectric capacitance and a large energy band gap can be obtained by controlling the substrate temperature, the concentration of the $O_3$ gas, and the exposed time of the $O_3$ gas through the ALD method. Accordingly, if the $ZrO_2$ layer is applied to the capacitor of a dynamic random access memory (DRAM), a highly integrated DRAM device with a size of approximately 50 nm or less can be easily developed.

For instance, according to the described embodiment of the present invention, the $ZrO_2$ layer can be used as not only the dielectric layer of the capacitor but also a gate oxide layer, a dielectric layer of a RF device, or an inter-poly oxide (IPO) layer of a flash memory device.

According to the described embodiment of the present invention, a $ZrO_2$ layer with a tetragonal structure can be formed by controlling a substrate temperature, a concentration of an $O_3$ gas, and an exposed time of the $O_3$ gas. Accordingly, it is possible to apply the $ZrO_2$ layer having a high dielectric constant and a large energy band gap to a dielectric layer of a capacitor and thus, highly integrated DRAM device with a size of approximately 50 nm or less can be developed.

While the present invention has been described with respect to certain preferred embodiments, it will be apparent to those skilled in the art that various changes and modifications may be made without departing from the spirit and scope of the invention as defined in the following claims.

What is claimed is:

1. A method for forming a zirconium oxide ($ZrO_2$) layer over a substrate in a chamber, comprising:
   controlling a temperature of the substrate; and
   repeating a unit cycle of an atomic layer deposition (ALD) method, the unit cycle comprising:
      supplying a zirconium (Zr) source into the chamber, parts of the Zr source being adsorbed into a surface of the substrate,
      purging parts of the Zr source remaining inside the chamber,
      supplying a reaction gas for reacting with the adsorbed parts of the Zr source, and
      purging non-reacted parts of the reaction gas remaining inside the chamber and reaction byproducts,
   wherein the temperature of the substrate and a concentration of the reaction gas are controlled such that the $ZrO_2$ layer is formed with a tetragonal structure, wherein controlling a temperature of the substrate comprises controlling the temperature of the substrate to be in a range from approximately 250° C. to approximately 350° C., and wherein supplying the reaction gas comprises supplying ozone ($O_3$) gas having a concentration of at least approximately 150 g/m$^3$.

2. The method of claim 1, wherein supplying the reaction gas comprises supplying an oxidant.

3. The method of claim 1, wherein supplying the reaction gas comprises supplying ozone ($O_3$) gas for at least approximately 1 second.

4. The method of claim 1, wherein supplying the Zr source comprises supplying a material selected from a group consisting of $Zr[O\text{-}tBu]_4$, $Zr[N(CH_3)_2]_4$, $Zr[N(C_2H_5)(CH_3)]_4$, $Zr[N(C_2H_5)_2]_4$, $Zr(TMHD)_4$, $Zr(OiC_3H_7)_3(TMHD)$, and $Zr(OtBu)_4$.

5. The method of claim 1, wherein the chamber comprises one of a single wafer type apparatus and a batch type furnace.

6. The method of claim 1, further comprising, after repeating the unit cycle, performing a post-annealing process.

7. The method of claim 6, wherein the post-annealing process is performed at a temperature of at least approximately 400° C.

8. The method of claim 6, wherein the post-annealing process comprises one of a rapid thermal process and a furnace thermal process.

9. The method of claim 6, wherein the post-annealing process is performed in an atmosphere selected from a group consisting of oxygen ($O_2$), ozone ($O_3$), and $O_2$ plasma.

10. The method of claim 1, wherein the method comprises forming the $ZrO_2$ layer on an electrode formed on a semiconductor substrate.

11. The method of claim 1, wherein the unit cycle further comprises:
supplying a second reaction gas for reacting with the adsorbed parts of the Zr source, and
purging non-reacted parts of the second reaction gas and reaction byproducts.

12. The method of claim 1, further comprising:
forming a top electrode over the $ZrO_2$ layer, and
performing, after forming the top electrode, an annealing process to improve a dielectric property of the $ZrO_2$ layer.

13. A method for fabricating a capacitor, comprising:
forming a bottom electrode on a substrate;
forming a zirconium oxide ($ZrO_2$) layer having a tetragonal structure over the bottom electrode using an atomic layer deposition (ALD) method;
performing a first annealing process to improve a tetragonality of the $ZrO_2$ layer;
forming a top electrode over the $ZrO_2$ layer; and
performing, after forming the top electrode, a second annealing process to improve a dielectric property of the $ZrO_2$ layer,
wherein forming the $ZrO_2$ layer comprises controlling a temperature of the substrate and repeating a unit cycle, the unit cycle comprising
supplying a zirconium (Zr) source into a chamber, parts of the Zr source being adsorbed into a surface of the substrate including the bottom electrode,
purging non-absorbed parts of the Zr source remaining in the chamber,
supplying a reaction gas for reacting with the adsorbed parts of the Zr source, and
purging non-reacted parts of the reaction gas and reaction byproducts,
wherein the temperature of the substrate and a concentration of the reaction gas are controlled such that the $ZrO_2$ layer is formed with a tetragonal structure,
wherein controlling a temperature of the substrate comprises controlling the temperature of the substrate to be in a range from approximately 250° C. to approximately 350° C., and
wherein supplying the reaction gas comprises supplying ozone ($O_3$) gas having a concentration of at least approximately 150 g/m$^3$.

14. The method of claim 13, wherein supplying the reaction gas comprises supplying an oxidant.

15. The method of claim 13, wherein supplying the reaction gas comprises supplying $O_3$ gas for at least approximately 1 second.

16. The method of claim 13, wherein supplying the Zr source comprises supplying a material selected from a group consisting of $Zr[O\text{-}tBu]_4$, $Zr[N(CH_3)_2]_4$, $Zr[N(C_2H_5)(CH_3)]_4$, $Zr[N(C_2H_5)_2]_4$, $Zr(TMHD)_4$, $Zr(OiC_3H_7)_3(TMHD)$, and $Zr(OtBu)_4$.

17. The method of claim 13, wherein the chamber comprises one of a single wafer type apparatus and a batch type furnace.

18. The method of claim 13, wherein forming the $ZrO_2$ layer comprises repeating a unit cycle, the unit cycle further comprising:
supplying a second reaction gas for reacting with the adsorbed parts of the Zr source, and
purging non-reacted parts of the second reaction gas and reaction byproducts.

19. The method of claim 18, wherein supplying the first reaction gas comprises supplying an oxidant.

20. The method of claim 18, wherein supplying the second reaction gas comprises supplying an oxidant.

21. The method of claim 18, wherein supplying the first reaction gas and supplying the second reaction gas comprise supplying ozone ($O_3$) gas for at least approximately 1 second.

22. The method of claim 18, wherein supplying the Zr source comprises supplying a material selected from a group consisting of $Zr[O\text{-}tBu]_4$, $Zr[N(CH_3)_2]_4$, $Zr[N(C_2H_5)(CH_3)]_4$, $Zr[N(C_2H_5)_2]_4$, $Zr(TMHD)_4$, $Zr(OiC_3H_7)_3(TMHD)$, and $Zr(OtBu)_4$.

23. The method of claim 18, wherein the chamber comprises one of a single wafer type apparatus and a batch type furnace.

24. The method of claim 13, wherein the first annealing process is performed at least approximately 400° C. or higher.

25. The method of claim 13, wherein the first annealing process comprises one of a rapid thermal process and a furnace thermal process.

26. The method of claim 13, wherein the first annealing process is performed in an atmosphere selected from a group consisting of $O_2$, $O_3$, and $O_2$ plasma.

27. The method of claim 13, wherein the second annealing process is performed in one of nitrogen ($N_2$), argon (Ar), and vacuum.

28. The method of claim 13, further comprising forming a dielectric layer, the dielectric layer and the $ZrO_2$ layer forming a stacked layer, the dielectric layer being formed of a material selected from a group consisting of aluminum oxide ($Al_2O_3$), titanium oxide ($TiO_2$), tantalum oxide ($Ta_2O_5$), hafnium oxide ($HfO_2$), and lanthanum oxide ($La_2O_3$).

* * * * *